US006794909B1

(12) United States Patent
Urakami et al.

(10) Patent No.: US 6,794,909 B1
(45) Date of Patent: Sep. 21, 2004

(54) OUTPUT CIRCUIT OF SEMICONDUCTOR DEVICE HAVING ADJUSTABLE DRIVING CAPABILITY

(75) Inventors: Aki Urakami, Hyogo (JP); Michio Nakajima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/644,922

(22) Filed: Aug. 21, 2003

(30) Foreign Application Priority Data

Apr. 14, 2003 (JP) ..................................... 2003-109237

(51) Int. Cl.$^7$ ............................................... H03K 3/00
(52) U.S. Cl. ..................... 327/112; 327/108; 327/170; 327/525; 326/83; 326/87
(58) Field of Search ................... 327/108–112, 170, 327/379, 389, 391, 525; 326/23, 24, 26–28, 83, 87

(56) References Cited

U.S. PATENT DOCUMENTS 5,041,738 A * 8/1991 Walters, Jr. ................. 327/170

5,821,783 A * 10/1998 Torimaru et al. ........... 327/108

FOREIGN PATENT DOCUMENTS

| JP | 5-152930 | 6/1993 |
| JP | 5-308272 | 11/1993 |
| JP | 7-38408 | 2/1995 |
| JP | 2000-357956 | 12/2000 |

* cited by examiner

Primary Examiner—Long Nguyen
(74) Attorney, Agent, or Firm—Burns, Doane, Swecker & Mathis, L.L.P.

(57) ABSTRACT

In an output circuit of a semiconductor device, an output buffer circuit includes a P-channel MOS transistor and a resistor connected in series between a line of a power supply potential and an output node. Current driving capability of the output buffer circuit is adjusted by making the P-channel MOS transistor nonconductive when a fuse is not blown, and making P-channel MOS transistor conductive when the fuse is blown. Thus, desired circuit characteristics can be obtained. Further, measures against electrostatic discharge can be taken by providing the resistor between a drain of the P-channel MOS transistor and the output node.

4 Claims, 9 Drawing Sheets

OUTPUT CIRCUIT OF SEMICONDUCTOR DEVICE HAVING ADJUSTABLE DRIVING CAPABILITY

BACKGROUND OF THE INVENTION

1. Field of the Invention

The present invention relates to an output circuit of a semiconductor device. In particular, the invention relates to an output circuit of a semiconductor device for outputting an internal signal to the outside.

2. Description of the Background Art

In a system having a plurality of semiconductor devices, a faster interface between the semiconductor devices is desired. For example, in the mobile phone market in which faster, smaller, and larger-capacity memories are required, a plurality of flash memories, static random access memories (SRAMs), and the like are mounted together. In this case, there is a task to stably set switching time between the semiconductor devices to a desired value.

In conventional output circuits of semiconductor devices, a structure having a plurality of CMOS (Complementary Metal-Oxide-Semiconductor) inverters connected in parallel is often used. Although an output circuit having such a structure is designed to have desired circuit characteristics, when variations occur in the characteristics of a MOS transistor during a manufacturing process, there arises a problem that switching time fails to be a desired value.

To solve the foregoing problem, a buffer circuit is proposed in which a fuse portion is provided to each gate of a plurality of P-channel MOS transistors in a PMOS selector circuit connected in parallel with a P-channel MOS transistor, and to each gate of a plurality of N-channel MOS transistors in an NMOS selector circuit connected in parallel with an N-channel MOS transistor. In this case, circuit characteristics of the buffer circuit can be optimized by appropriately cutting the fuse portion to separate part of the plurality of P-channel MOS transistors or N-channel MOS transistors (for example, see Japanese Patent Laying-Open No. 7-38408, which will hereinafter be referred to as a document 1).

There is proposed another buffer circuit having a plurality of CMOS-structure inverter circuits connected in parallel, in which a driving circuit is provided to shut off power supplied to each of a F-channel MOS transistor and an N-channel MOS transistor in at least one of the inverter circuits. A threshold value of the buffer circuit is varied by appropriately changing the number of the respective MOS transistors to be driven (for example, see Japanese Patent Laying-Open No. 5-152930, which will hereinafter be referred to as a document 2).

Further, there is a high-load driving circuit having a plurality of inverters connected in parallel including a P-channel MOS transistor and an N-channel MOS transistor having each gate connected to a fuse. Driving capability of the driving circuit is adjusted by cutting the fuse provided to each inverter as required (for example, see Japanese Patent Laying-Open No. 5-308272, which will hereinafter be referred to as a document 3).

Furthermore, there is an output circuit in which output characteristics of the output circuit are automatically set when an LSI device is operated, by using a monitor circuit having a dummy transistor equivalent to a transistor in the output circuit, and supplying a setting signal to the output circuit based on the result of monitoring a current value of the dummy transistor (for example, see Japanese Patent Laying-Open No. 2000-357956, which will hereinafter be referred to as a document 4).

The present invention aims at optimizing circuit characteristics of an output circuit through a method different from methods proposed in the foregoing documents 1 to 4. In addition, since a semiconductor device has tended to have less tolerance to static electricity in recent years due to a thinner oxide film or the like resulting from miniaturization and higher integration of the semiconductor device, it is necessary to take measures against electrostatic discharge (ESD). However, there is no description about the measures against electrostatic discharge in the methods proposed in the foregoing documents 1 to 4.

SUMMARY OF THE INVENTION

A main object of the present invention is to provide an output circuit of a semiconductor device by which desired circuit characteristics can be obtained and measures against electrostatic discharge can be taken.

An output circuit of a semiconductor device in accordance with the present invention includes an inverter including a first transistor of a first conductivity type and a second transistor of a second conductivity type connected between lines of first and second power supply potentials and an output node, respectively, and having input electrodes both receiving an internal signal; a third transistor of the first conductivity type and a first resistor connected in series between the line of the first power supply potential and the output node; and an adjustment circuit including a fuse, for making the third transistor nonconductive when the fuse is not blown, and connecting input electrodes of the first and the third transistors when the fuse is blown, to adjust current driving capability of the output circuit. Therefore, desired circuit characteristics can be obtained by correcting variations in characteristics of MOS transistors caused during a manufacturing process with the adjustment circuit. Further, measures against electrostatic discharge can be taken by providing the resistor between a drain of the third transistor and the output node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
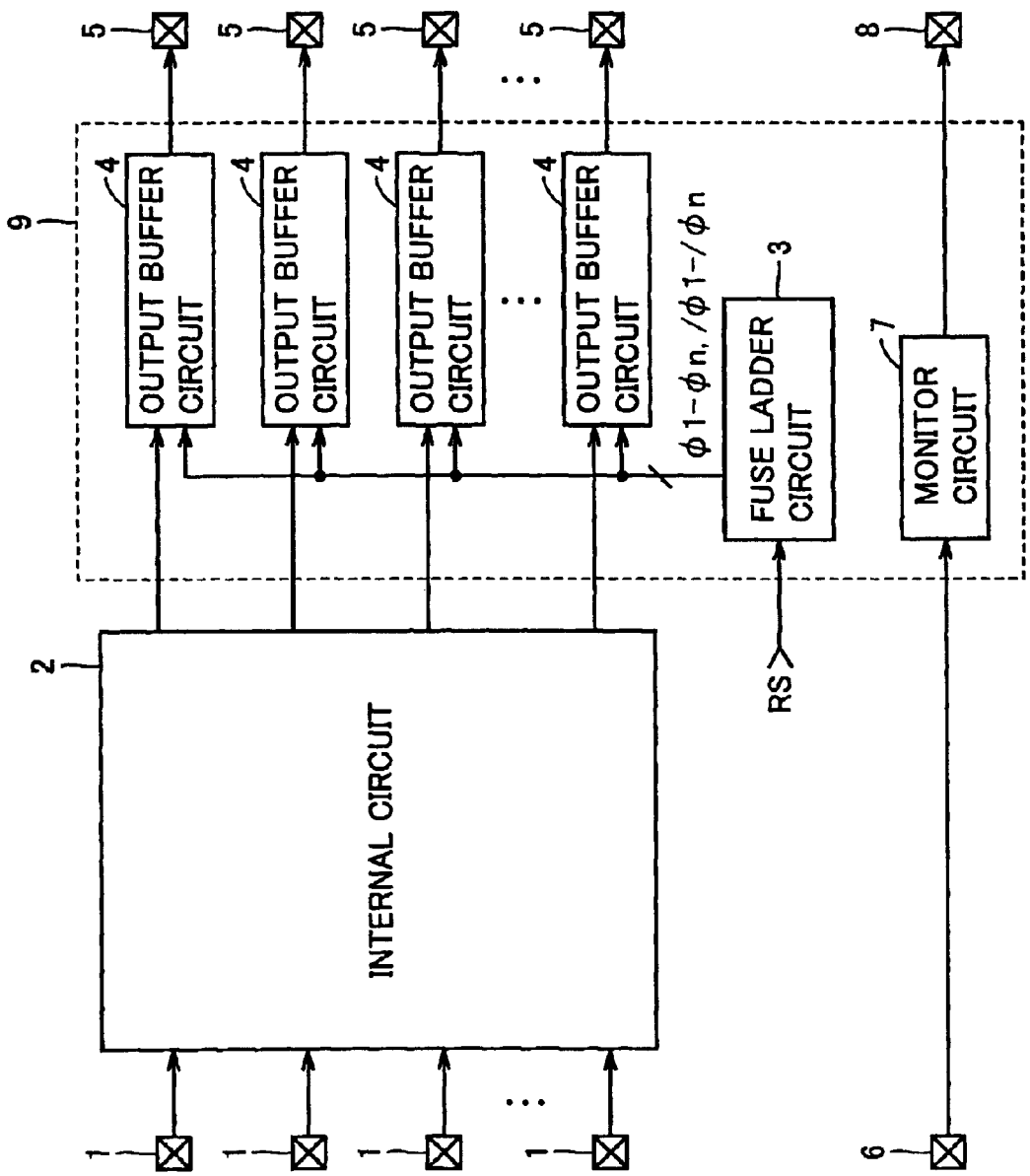
FIG. 1 is a diagram illustrating a structure of a main portion of a semiconductor integrated circuit device in accordance with a first embodiment of the present invention.

In FIG. 1, a semiconductor integrated circuit device in accordance with a first embodiment has input terminals 1 and 6, an internal circuit 2, an output circuit 9, and output terminals 5 and 8. Output circuit 9 includes a fuse ladder circuit 3, an output buffer circuit 4, and a monitor circuit 7. In the following description, a character "/" represents inversion.

Internal circuit 2 performs a predetermined operation according to a plurality of signals externally supplied via a plurality of input terminals 1, and generates a plurality of signals to supply them to a plurality of output buffer circuits 4, respectively. Fuse ladder circuit 3 generates complementary switch signals $\phi 1-\phi n$ and $/\phi 1-/\phi n$ based on an external reset signal RS. Output buffer circuit 4 receives an output signal of internal circuit 2 and output switch signals $\phi 1-\phi n$ and $/\phi 1-/\phi n$ of fuse ladder circuit 3, and amplifies current of the output signal of internal circuit 2 with current driving capability according to switch signals $\phi 1-\phi n$ and $/\phi 1-/\phi n$, for transmission to output terminal 5. Monitor circuit 7 receives an external monitor signal via input terminal 6, and outputs a measuring signal to output terminal 8.

Figure 2:
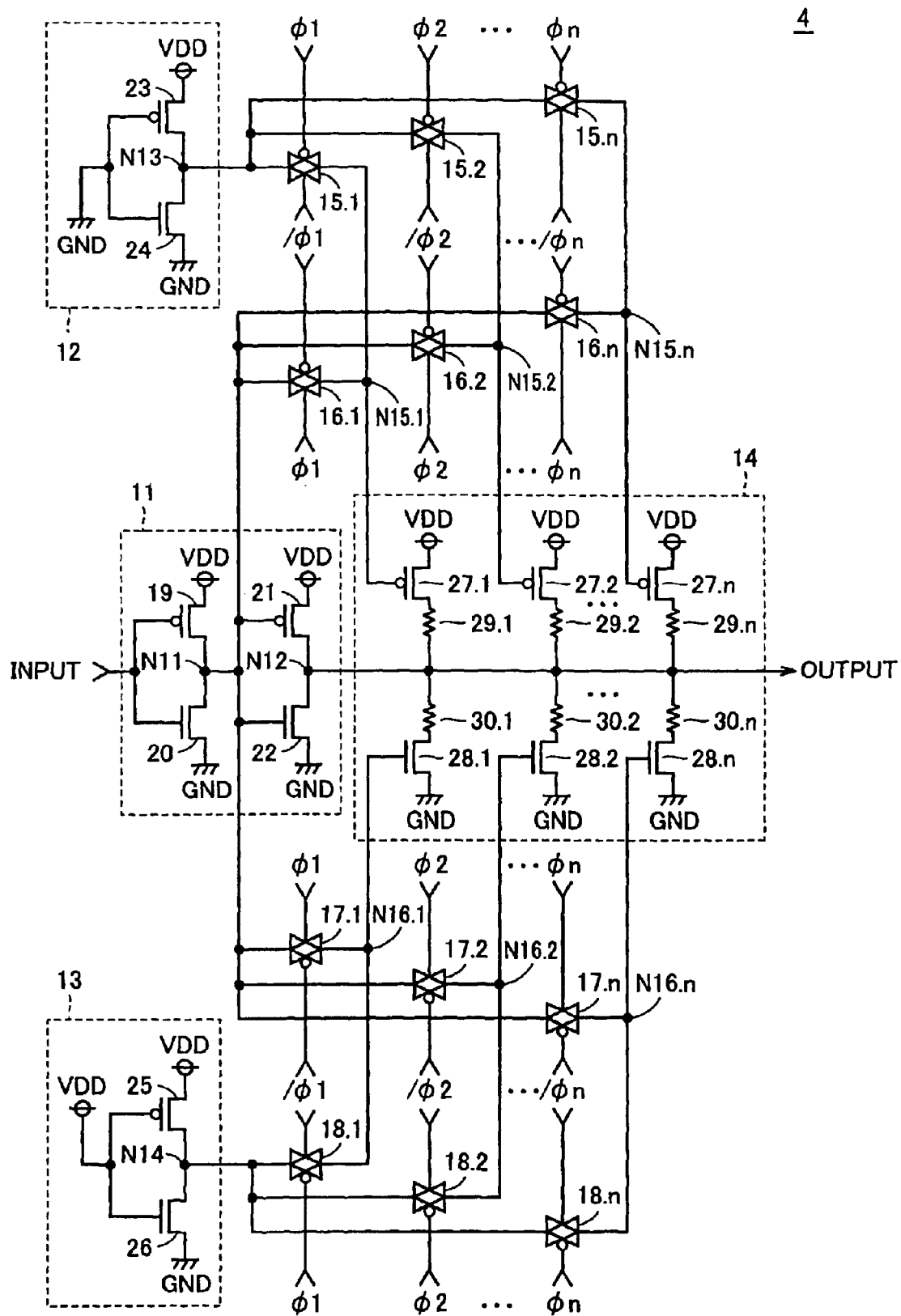
FIG. 2 is a circuit diagram illustrating a structure of an output buffer circuit shown in FIG. 1.

FIG. 2 is a circuit diagram illustrating a structure of output buffer circuit 4 shown in FIG. 1. In FIG. 2, output buffer circuit 4 has a buffer circuit 11, potential output circuits 12 and 13, a correction circuit 14, and transfer gates 15.1–15.$n$, 16.1–16.$n$, 17.1–17.$n$ and 18.1–18.$n$.

Buffer circuit 11 includes P-channel MOS transistors 19, 21 and N-channel MOS transistors 20, 22. P-channel MOS transistor 19 and N-channel MOS transistor 20 are connected in series between a line of a power supply potential VDD and a line of a ground potential GND, and their gates both receive an output signal of internal circuit 2. P-channel MOS transistor 21 and N-channel MOS transistor 22 are connected in series between the line of power supply potential VDD and the line of ground potential GND, and their gates are both connected to an output node N11 between P-channel MOS transistor 19 and N-channel MOS transistor 20.

When the output signal of internal circuit 2 is at an H (high) level, P-channel MOS transistor 19 becomes nonconductive and N-channel MOS transistor 20 becomes conductive, causing output node N11 to be at an L (low) level. In response, P-channel MOS transistor 21 becomes conductive and N-channel MOS transistor 22 becomes nonconductive, causing an output node N12 to be at an H level. In contrast, when the output signal of internal circuit 2 is at an L level, P-channel MOS transistor 19 becomes conductive and N-channel MOS transistor 20 becomes nonconductive, causing output node N11 to be at an H level. In response, P-channel MOS transistor 21 becomes nonconductive and N-channel MOS transistor 22 becomes conductive, causing output node N12 to be at an L level. Buffer circuit 11 amplifies the current of the output signal of internal circuit 2.

Potential output circuit 12 includes a P-channel MOS transistor 23 and an N-channel MOS transistor 24. P-channel MOS transistor 23 and N-channel MOS transistor 24 are connected in series between the line of power supply potential VDD and the line of ground potential GND, and their gates are both connected to the line of ground potential GND.

P-channel MOS transistor 23 becomes conductive when its gate receives a potential at an L level (ground potential GND), and N-channel MOS transistor 24 becomes nonconductive when its gate receives a potential at an L level (ground potential GND). Thus, a potential of an output node N13 attains an H level.

Potential output circuit 13 includes a P-channel MOS transistor 25 and an N-channel MOS transistor 26. P-channel MOS transistor 25 and N-channel MOS transistor 26 are connected in series between the line of power supply potential VDD and the line of ground potential GND, and their gates are both connected to the line of power supply potential VDD.

P-channel MOS transistor 25 becomes nonconductive when its gate receives a potential at an H level (power supply potential VDD), and N-channel MOS transistor 26 becomes conductive when its gate receives a potential at an H level (power supply potential VDD). Thus, a potential of an output node N14 attains an L level.

Transfer gates 15.1–15.$n$ are connected between output node N13 and nodes N15.1–N15.$n$, respectively. Transfer gates 16.1–16.$n$ are connected between output node N11 and nodes N15.1–N15.$n$, respectively. Transfer gates 17.1–17.$n$ are connected between output node N11 and nodes N16.1–N16.$n$, respectively. Transfer gates 18.1–18.$n$ are connected between output node N14 and nodes N16.1–N16.$n$, respectively. Gates of transfer gates 15.1–15.$n$ and 18.1–18.$n$ on the side of the P-channel MOS transistors receive output switch signals $\phi 1-\phi n$ of fuse ladder circuit 3, respectively, and their gates on the side of the N-channel MOS transistors receive output switch signals $/\phi 1-/\phi n$ of fuse ladder circuit 3, respectively. Gates of transfer gates 16.1–16.$n$ and 17.1–17.$n$ on the side of the P-channel MOS transistors receive output switch signals $/\phi 1-/\phi n$ of fuse ladder circuit 3, respectively, and their gates on the side of the N-channel MOS transistors receive output switch signals $\phi 1-\phi n$ of fuse ladder circuit 3, respectively.

When switch signals $\phi 1-\phi n$ are at an L level and switch signals $/\phi 1-/\phi n$ are at an H level, transfer gates 15.1–15.$n$ and 18.1–18.$n$ become conductive, and transfer gates 16.1–16.$n$ and 17.1–17.$n$ become nonconductive. Thus, nodes N15.1–N15.$n$ attain an H level, the same level as that of node N13, and nodes N16.1–N16.$n$ attain an L level, the same level as that of node N14.

When switch signals $\phi 1-\phi n$ are at an H level and switch signals $/\phi 1-/\phi n$ are at an L level, transfer gates 15.1–15.$n$ and 18.1–18.$n$ become nonconductive, and transfer gates 16.1–16.$n$ and 17.1–17.$n$ become conductive. Thus, nodes N15.1–N15.$n$ and N16.1–N16.$n$ attain the same signal level as that of output node N11.

Correction circuit 14 includes P-channel MOS transistors 27.1–27.$n$, N-channel MOS transistors 28.1–28.$n$, and resistors 29.1–29.$n$ and 30.1–30.$n$. P-channel MOS transistors 27.1–27.$n$ have sources each connected to the line of power supply potential VDD, and drains connected to output node N12 via resistors 29.1–29.$n$, respectively. Gates of P-channel MOS transistors 27.1–27.$n$ are connected to nodes N15.1–N15.$n$, respectively. Each of resistors 30.1–30.$n$ has one electrode connected to output node N12, and the other electrode connected to the line of ground potential GND via respective N-channel MOS transistor 28.1–28.$n$. Gates of N-channel MOS transistors 28.1–28.$n$ are connected to nodes N16.1–N16.$n$, respectively.

When switch signals $\phi1$–$\phi n$ are at the L level and switch signals /$\phi1$–/$\phi n$ are at the H level, nodes N15.1–N15.$n$ attain the H level, and nodes N16.1–N16.$n$ attain the L level. In response, P-channel MOS transistors 27.1–27.$n$ and N-channel MOS transistors 28.1–28.$n$ become nonconductive, and thus, output buffer circuit 4 becomes equivalent to a circuit formed with buffer circuit 11 only.

When switch signals $\phi1$–$\phi n$ are at the H level and switch signals /$\phi1$–$\phi n$ are the L level, nodes N15.1–N15.$n$ and N16.1–N16.$n$ attain the same signal level as that of output node N11. When output node N11 is at the L level, P-channel MOS transistors 27.1–27.$n$ become conductive and N-channel MOS transistors 28.1–28.$n$ become nonconductive, causing output node N12 to be at the H level. In contrast, when output node N11 is at the H level, P-channel MOS transistors 27.1–27.$n$ become nonconductive and N-channel MOS transistors 28.1–28.$n$ become conductive, causing output node N12 to be at the L level. Therefore, current driving capability of output buffer circuit 4 can be adjusted by switching the level of each of switch signals $\phi1$–$\phi n$ and /$\phi1$–/$\phi n$ to be at the H level or the L level. It is to be noted that, by employing small-sized transistors as P-channel MOS transistors 27.1–27.$n$ and N-channel MOS transistors 28.1–28.$n$, small-sized output buffer circuit 4 can be realized, and the current driving capability of output buffer circuit 4 can be finely adjusted.

Since P-channel MOS transistors 27.1–27.$n$ and N-channel MOS transistors 28.1–28.$n$ are small in size, they may be damaged when a surge voltage due to electrostatic discharge is applied to output node N12. However, by providing resistors 29.1–29.$n$ between the drains of P-channel MOS transistors 27.1–27.$n$ and output node N12, respectively, and providing resistors 30.1–30.$n$ between the drains of N-channel MOS transistors 28.1–28.$n$ and output node N12, respectively, P-channel MOS transistors 27.1–27.$n$ and N-channel MOS transistors 28.1–28.$n$ are less affected by the surge voltage and prevented from being damaged.

Figure 3:
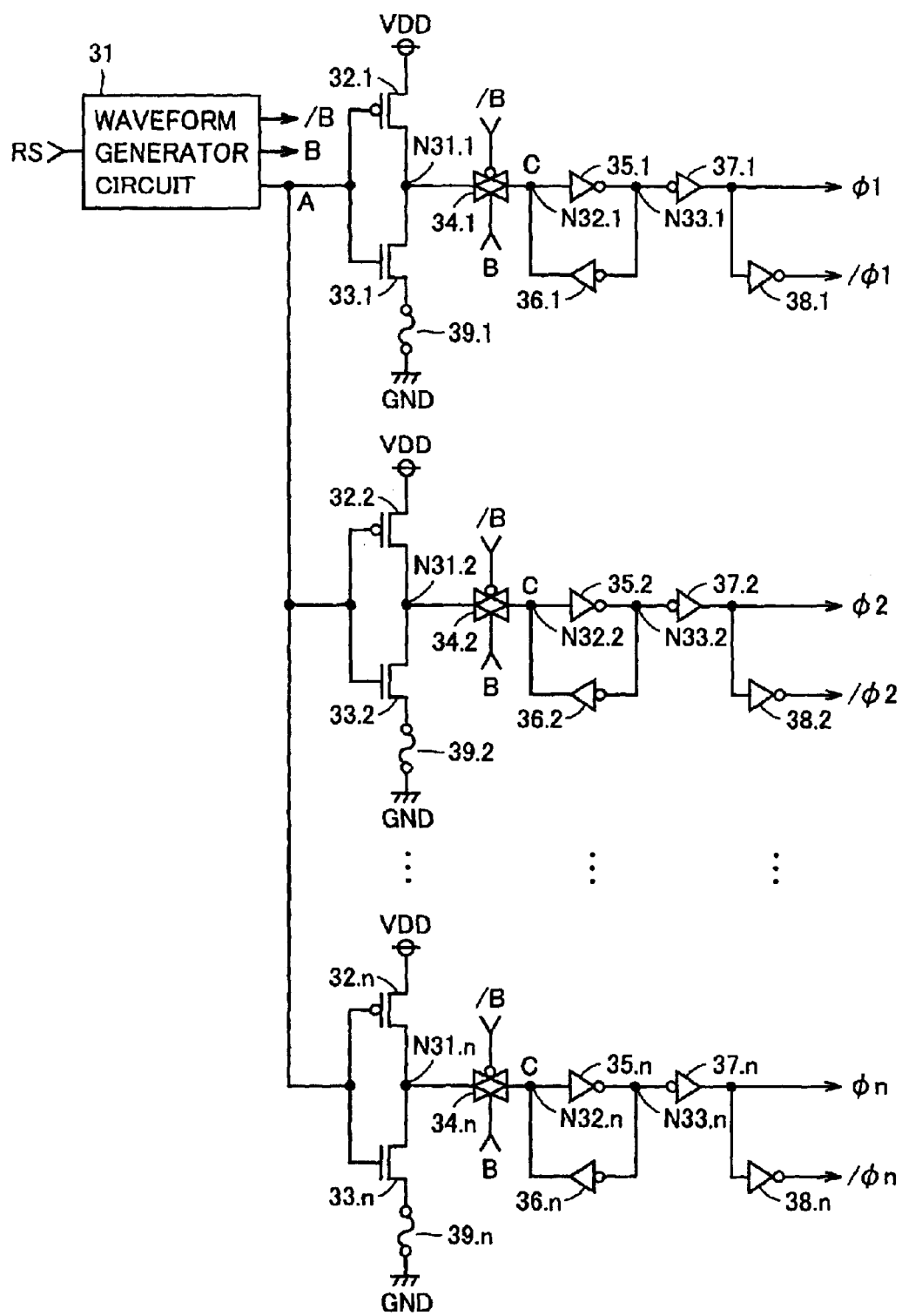
FIG. 3 is a circuit diagram illustrating a structure of a fuse ladder circuit shown in FIG. 1.

FIG. 3 is a circuit diagram illustrating a structure of fuse ladder circuit 3 shown in FIG. 1. In FIG. 3, fuse ladder circuit 3 includes a waveform generator circuit 31, P-channel MOS transistors 32.1–32.$n$, N-channel MOS transistors 33.1–33.$n$, transfer gates 34.1–34.$n$, inverters 35.1–35.$n$, 36.1–36.$n$, 37.1–37.$n$ and 38.1–38.$n$, and fuses 39.1–39.$n$.

Waveform generator circuit 31 receives external reset signal RS, and generates a signal A and complementary switch signals B and /B. P-channel MOS transistors 32.1–32.$n$ are connected between the line of power supply potential VDD and output nodes N31.1–N31.$n$, respectively, and their gates all receive output signal A of waveform generator circuit 31. N-channel MOS transistors 33.1–33.$n$ have drains connected to output nodes N31.1–N31.$n$, respectively, and sources connected to the line of ground potential GND via fuses 39.1–39.$n$, respectively. Gates of N-channel MOS transistors 33.1–33.$n$ all receive output signal A of waveform generator circuit 31. Transfer gates 34.1–34.$n$ are connected between output nodes N31.1–N31.$n$ and nodes N32.1–N32.$n$, respectively. Gates of transfer gates 34.1–34.$n$ on the side of the P-channel MOS transistors receive output switch signal /B of waveform generator circuit 31, and their gates on the side of the N-channel MOS transistors receive output switch signal B of waveform generator circuit 31. Inverters 35.1–35.$n$ are connected between nodes N32.1–N32.$n$ and nodes N33.1–N33.$n$, respectively, and inverters 36.1–36.$n$ are connected between nodes N33.1–N33.$n$ and nodes N32.1–N32.$n$, respectively, constituting latch circuits. Inverters 37.1–37.$n$ receive signals from nodes N33.1–N33.$n$ to output switch signals $\phi1$–$\phi n$, respectively, and they are connected to inverters 38.1–38.$n$, respectively. Inverters 38.1–38.$n$ output switch signals /$\phi1$–/$\phi n$, respectively.

Figure 4:
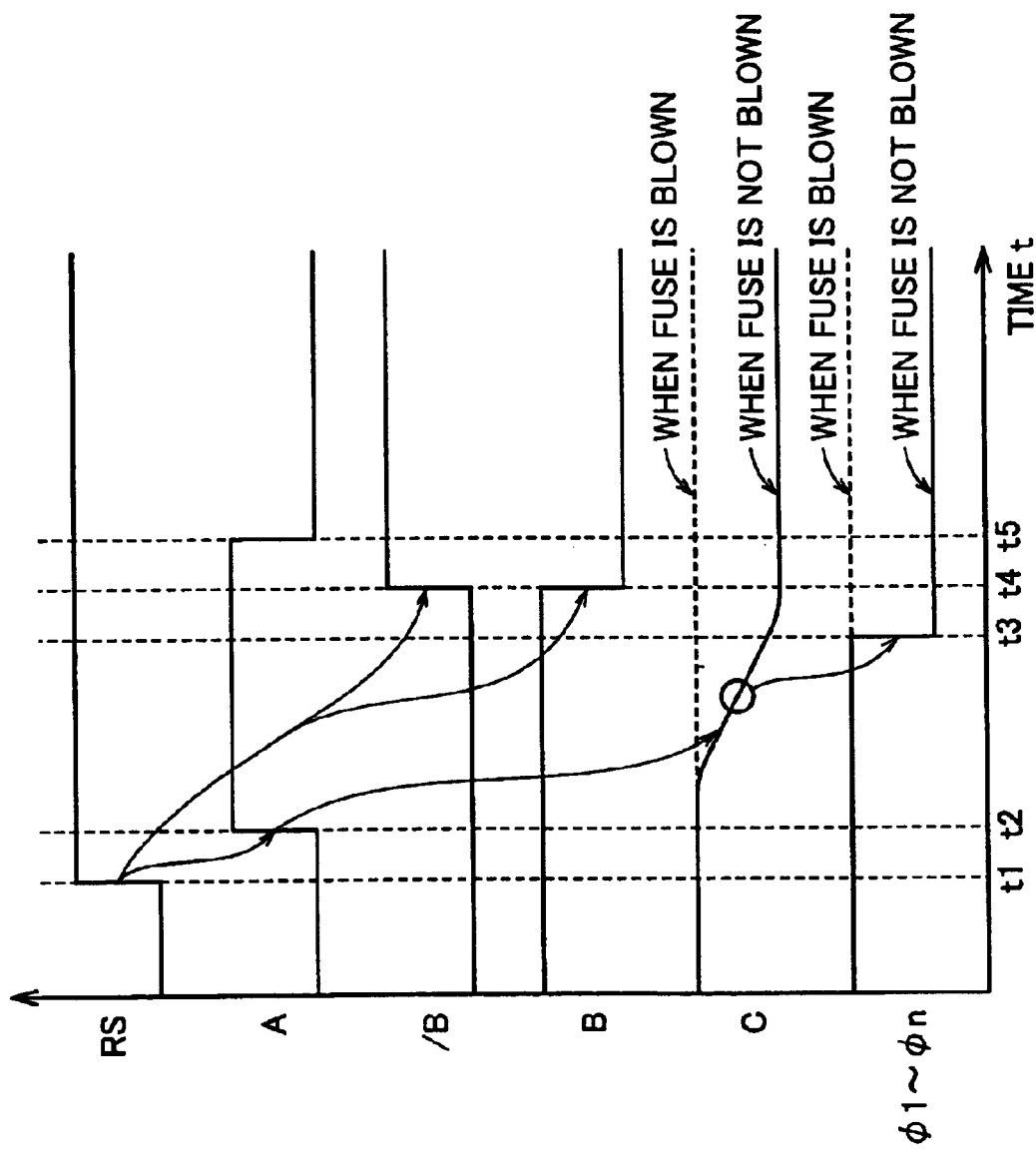
FIG. 4 is a timing chart for illustrating an operation of the fuse ladder circuit shown in FIG. 3.

FIG. 4 is a timing chart for illustrating an operation of fuse ladder circuit 3. In response to a rise of reset signal RS to an H level at time t1, output signal A of waveform generator circuit 31 rises to an H level at time t2. Here, since transfer gates 34.1–34.$n$ are conductive, receiving switch signal /B at an L level and switch signal B at an H level, nodes N32.1–N32.$n$ directly receive signals of output nodes N31.1–N31.$n$, respectively.

When fuses 39.1–39.$n$ are not blown (cut), in response to the rise of signal A to the H level at time t2, P-channel MOS transistors 32.1–32.$n$ become nonconductive and N-channel MOS transistors 33.1–33.$n$ become conductive. Here, a signal C of nodes N32.1–N32.$n$ gradually falls from an H level to an L level. In response to a fall in the signal level of signal C to a level lower than a threshold value of inverters 35.1–35.$n$, switch signals $\phi1$–$\phi n$ fall to an L level at time t3. Further, in response to the rise of reset signal RS to the H level at time t1, switch signal /B rises to an H level and switch signal B falls to an L level at time t4. In response, transfer gates 34.1–34.$n$ become nonconductive, and thus, output nodes N31.1–N31.$n$ and nodes N32.1–N32.$n$ are electrically separated, respectively. Here, since signal C at the L level is latched by the latch circuits formed with inverters 35.1–35.$n$ and 36.1–36.$n$, the level is prevented from becoming unstable. In response to a fall of signal A to an L level at time t5, P-channel MOS transistors 32.1–32.$n$ become conductive and N-channel MOS transistors 33.1–33.$n$ become nonconductive. Here, although nodes N31.1–N31.$n$ rise to an H level, transfer gates 34.1–34.$n$ are nonconductive, and thus, signal C and switch signals $\phi1$–$\phi n$ both remain at the L level.

When fuses 39.1–39.$n$ are blown, in response to the rise of signal A to the H level at time t2, P-channel MOS transistors 32.1–32.$n$ become nonconductive and N-channel MOS transistors 33.1–33.$n$ become conductive. However, since N-channel MOS transistors 33.1–33.$n$ and the line of ground potential GND are electrically separated by blown fuses 39.1–39.$n$, respectively, signal C and switch signals $\phi1$–$\phi n$ always remain at an H level.

Figure 5:
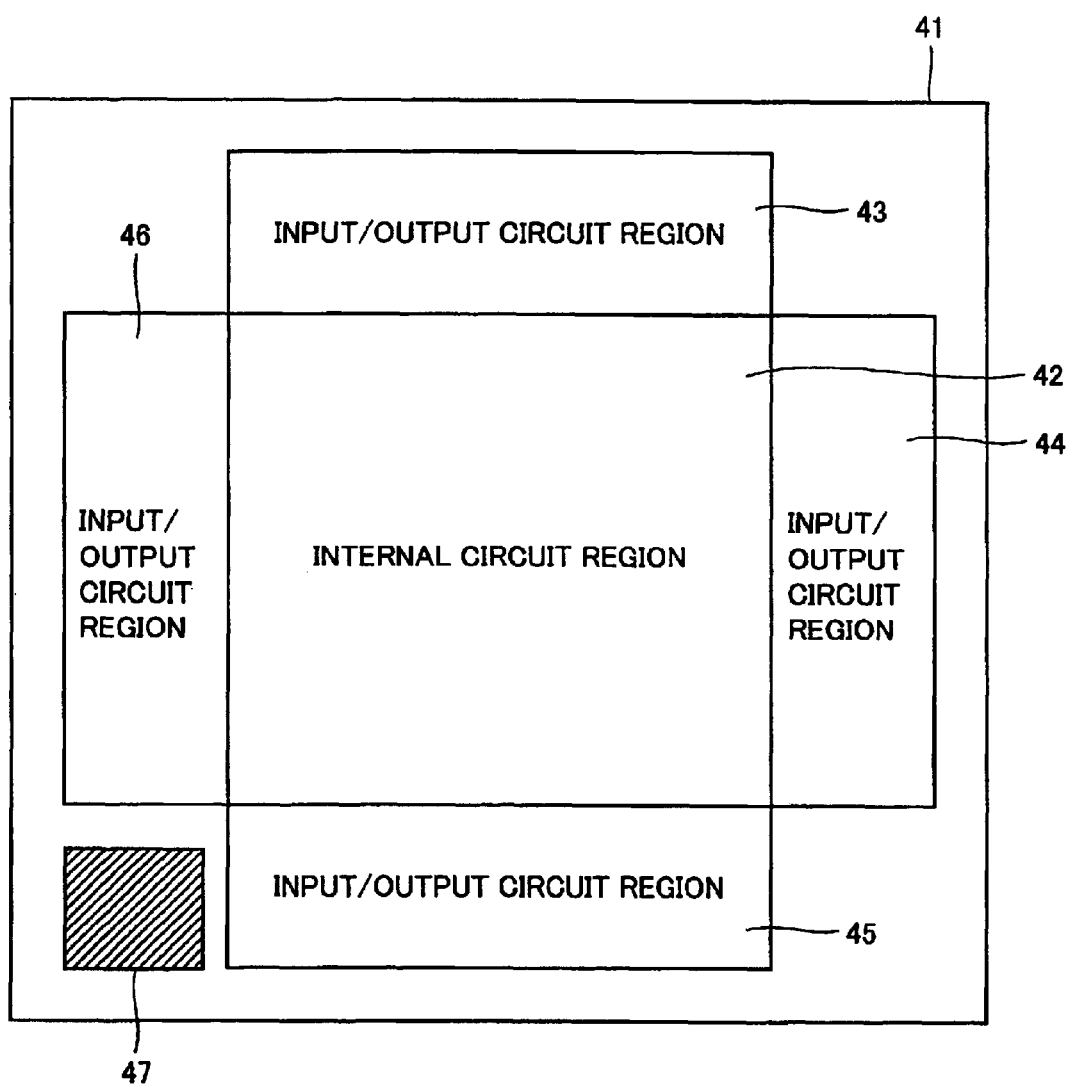
FIG. 5 is a layout view of the semiconductor integrated circuit device for illustrating a layout of the fuse ladder circuit shown in FIG. 3.

FIG. 5 is a layout view of the semiconductor integrated circuit device for illustrating a layout of fuse ladder circuit 3. In FIG. 5, components of the semiconductor integrated circuit device are located at an internal circuit region 42, input/output circuit regions 43 to 46, and a fuse ladder circuit region 47 on a semiconductor chip 41.

Internal circuit region 42 is located at a central part of semiconductor chip 41, and input/output circuit regions 43 to 46 are located outside of the four sides of internal circuit region 42, respectively. Fuse ladder circuit region 47 is located at the lower-left corner on semiconductor chip 41.

Internal circuit 2 shown in FIG. 1 is located in internal circuit region 42. Output buffer circuits 4 are located in input/output circuit regions 43 to 46. Fuse ladder circuit 3 is located in fuse ladder circuit region 47. Monitor circuit 7 is located at any place on semiconductor chip 41, such as input/output circuit regions 43 to 46 or fuse ladder circuit region 47.

It is to be noted that fuse ladder circuit region 47 may be located at any of the four corners on semiconductor chip 41. In this manner, a smaller semiconductor integrated circuit device can be realized by locating fuse ladder circuit region 47 at a corner on semiconductor chip 41.

Figure 6:
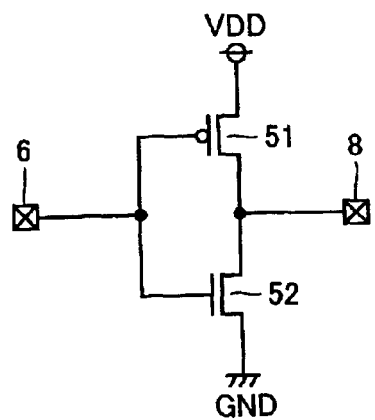
FIG. 6 is a circuit diagram illustrating a structure of a monitor circuit shown in FIG. 1.

FIG. 6 is a circuit diagram illustrating a structure of monitor circuit 7 shown in FIG. 1. Monitor circuit 7 is used to determine the number of fuses to be blown among fuses 39.1–39.$n$ in fuse ladder circuit 3 shown in FIG. 3. In FIG. 6, monitor circuit 7 includes a small-sized P-channel MOS transistor 51 and a small-sized N-channel MOS transistor 52.

P-channel MOS transistor 51 and N-channel MOS transistor 52 are connected in series between the line of power supply potential VDD and the line of ground potential GND, and their gates are both connected to input terminal 6. An output node between P-channel MOS transistor 51 and N-channel MOS transistor 52 is connected to output terminal 8.

When the monitor signal externally inputted to input terminal 6 is at an H level, P-channel MOS transistor 51 becomes nonconductive and N-channel MOS transistor 52 becomes conductive, causing output terminal 8 to be at an L level. In contrast, when the monitor signal is at an L level, P-channel MOS transistor 51 becomes conductive and N-channel MOS transistor 52 becomes nonconductive, causing output terminal 8 to be at an H level.

The measuring signal from output terminal 8 is measured by test equipment at the time of a shipment test of a semiconductor chip. The test equipment uses a current value of the measuring signal to perform operational processing by a program and determine the number of fuses to be blown. The fuses determined to be blown are blown by laser trimming or the like.

When an output signal of a large scale semiconductor chip is measured with a probe of the test equipment at the time of its shipment test, large current flows into the probe which has a very fine tip, and thus the tip of the probe is prone to thermal oxidation. However, by measuring the measuring signal from monitor circuit 7 having a small current value, instead of the output signal of output buffer circuit 4, thermal oxidation of the probe is lessened, achieving a longer life for the probe.

An operation of output circuit 9 of the semiconductor integrated circuit device will now be described. Explanation will be given on the case that two fuses 39.1 and 39.2 of fuse ladder circuit 3 are blown based on the result of measuring the measuring signal from monitor circuit 7 by the test equipment. Here, output switch signals $\phi1$, $\phi2$ and /$\phi3$–/$\phi n$ of fuse ladder circuit 3 attain an H level, and switch signals /$\phi1$, /$\phi2$ and $\phi3$–$\phi n$ attain an L level. In response, transfer gates 15.1, 15.2, 16.3–16.$n$, 17.3–17.$n$, 18.1 and 18.2 become nonconductive, and transfer gates 15.3–15.$n$, 16.1, 16.2, 17.1, 17.2 and 18.3–18.$n$ become conductive.

Figure 7:
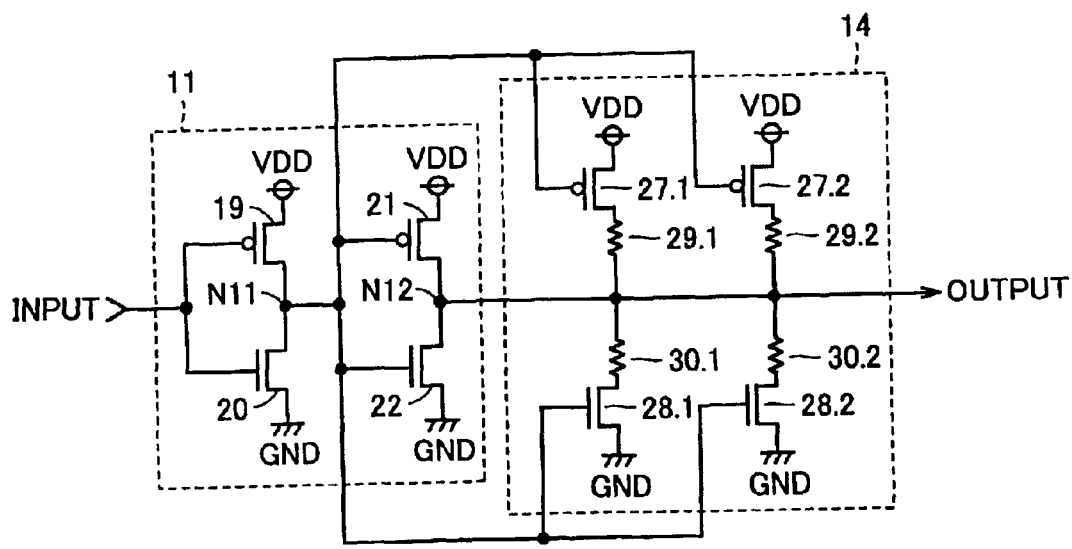
FIG. 7 is an equivalent circuit diagram for illustrating an operation of an output circuit shown in FIG. 1.

FIG. 7 is an equivalent circuit diagram for illustrating a structure of output buffer circuit 4 in this case. In FIG. 7, when the output signal of internal circuit 2 is at an H level, P-channel MOS transistor 19 becomes nonconductive and N-channel MOS transistor 20 becomes conductive, causing output node N11 to be at an L level. In response, P-channel MOS transistor 21 becomes conductive and N-channel MOS transistor 22 becomes nonconductive, causing output node N12 to be at an H level. Further, in response to output node N11 at the L level, P-channel MOS transistors 27.1 and 27.2 become conductive and N-channel MOS transistors 28.1 and 28.2 become nonconductive, causing output node N12 to be at the H level.

When the output signal of internal circuit 2 is at an L level, P-channel MOS transistor 19 becomes conductive and N-channel MOS transistor 20 becomes nonconductive, causing output node N11 to be at an H level. In response, P-channel MOS transistor 21 becomes nonconductive and N-channel MOS transistor 22 becomes conductive, causing output node N12 to be at an L level. Further, in response to output node N11 at the H level, P-channel MOS transistors 27.1 and 27.2 become nonconductive and N-channel MOS transistors 28.1 and 28.2 become conductive, causing output node N12 to be at the L level. Here, by providing correction circuit 14, the current driving capability of output buffer circuit 4 becomes greater than that of buffer circuit 11.

It is to be noted that, although explanation has been given on the case that two fuses are blown, the current driving capability of output buffer circuit 4 can be adjusted arbitrarily by changing the number of fuses to be blown.

Adjustment accuracy of the current driving capability of output buffer circuit 4 can be enhanced simply by further reducing the size of P-channel MOS transistors 27.1–27.$n$ and N-channel MOS transistors 28.1–28.$n$ in correction circuit 14. Adjustment range of the current driving capability can be widened simply by further increasing the numbers of P-channel MOS transistors 27.1–27.$n$, N-channel MOS transistors 28.1–28.$n$, and transfer gates 15.1–15.$n$, 16.1–16.$n$, 17.1–17.$n$, and 18.1–18.$n$, connected to these transistors.

Figure 8:
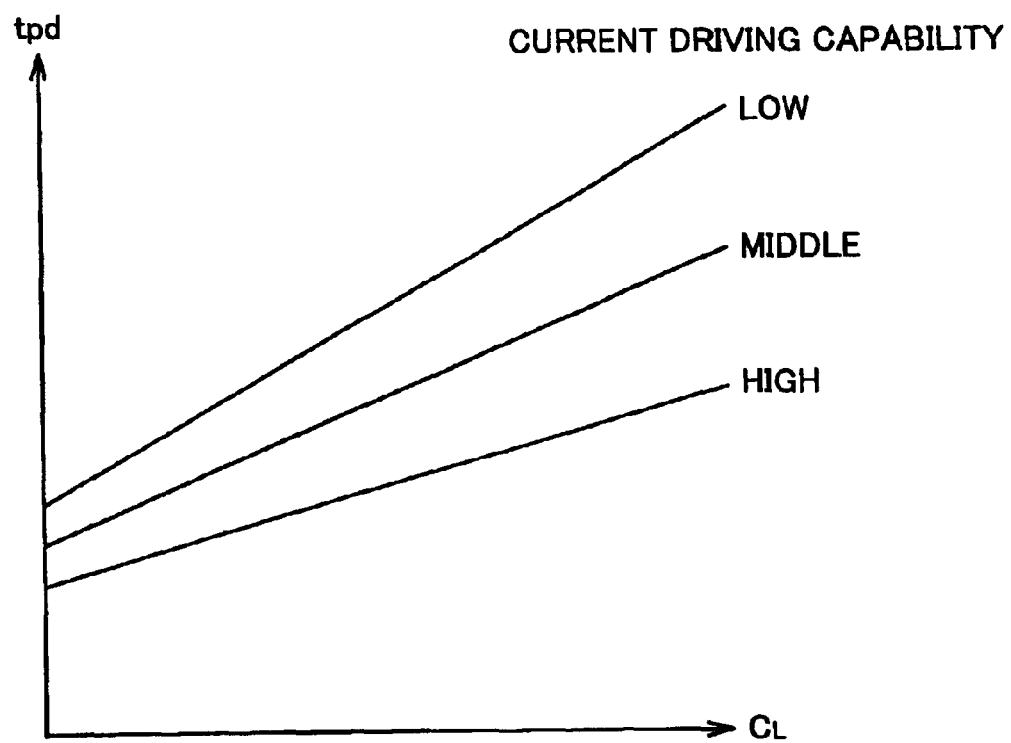
FIG. 8 is a graph illustrating relations between switching time tpd and each of output load CL and current driving capability of the output buffer circuit shown in FIG. 2.

FIG. 8 is a graph illustrating relations between switching time tpd and each of output load CL and the current driving capability of output buffer circuit 4. In FIG. 8, switching time tpd of output buffer circuit 4 becomes longer with increased output load CL, and with decreased current driving capability. In a conventional output circuit of a semiconductor integrated circuit device, if variations occur in characteristics of a manufactured MOS transistor, the output circuit tends to be affected by the variations, causing variations in current driving capability. Thus, switching time tpd fails to be a desired value.

However, in the first embodiment, the current driving capability of output buffer circuit 4 can be adjusted by changing the number of fuses to be blown in response to variations in characteristics of MOS transistors caused during a manufacturing process. In this manner, desired circuit characteristics can be obtained. Further, measures against electrostatic discharge can be taken by providing resistors 29.1–29.$n$ and 30.1–30.$n$, in correction circuit 14.

Second Embodiment

Figure 9:
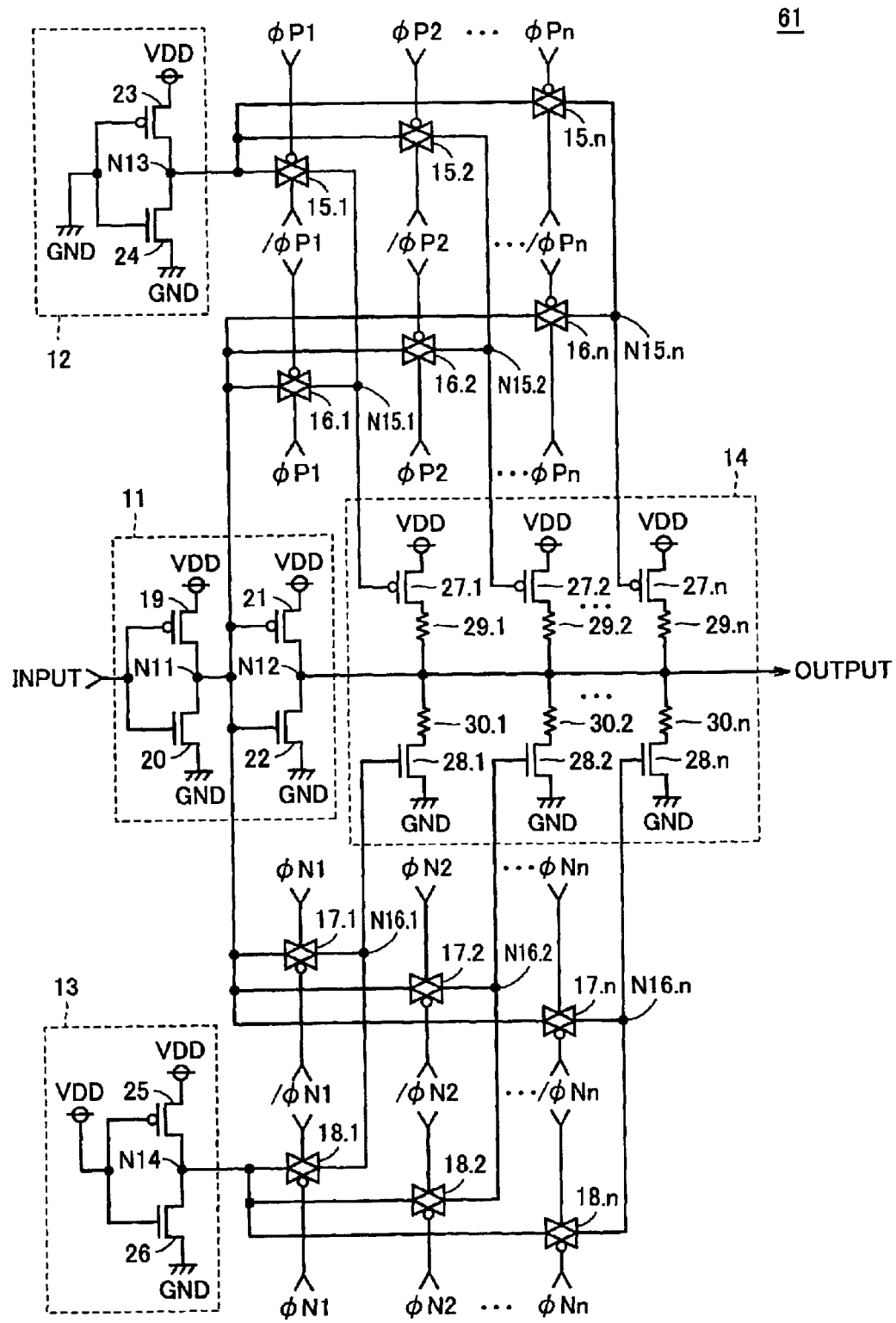
FIG. 9 is a circuit diagram illustrating a structure of an output buffer circuit of a semiconductor integrated circuit device in accordance with a second embodiment of the present invention.

FIG. 9 is a circuit diagram illustrating a structure of an output buffer circuit 61 of a semiconductor integrated circuit device in accordance with a second embodiment of the present invention, which is contrasted with FIG. 2. With reference to FIG. 9, output buffer circuit 61 is different from output buffer circuit 4 in FIG. 2 in that input switch signals $\phi1$–$\phi n$ and /$\phi1$–/$\phi n$ of transfer gates 15.1–15.$n$ and 16.1–16.$n$ are replaced with $\phi P1$–$\phi Pn$ and /$\phi P1$–/$\phi Pn$, and input switch signals $\phi1$–$\phi n$ and /$\phi1$–/$\phi n$ of transfer gates 17.1–17.$n$ and 18.1–18.$n$ are replaced with $\phi N1$–$\phi Nn$ and /$\phi N1$–/$\phi Nn$, respectively.

Figure 10:
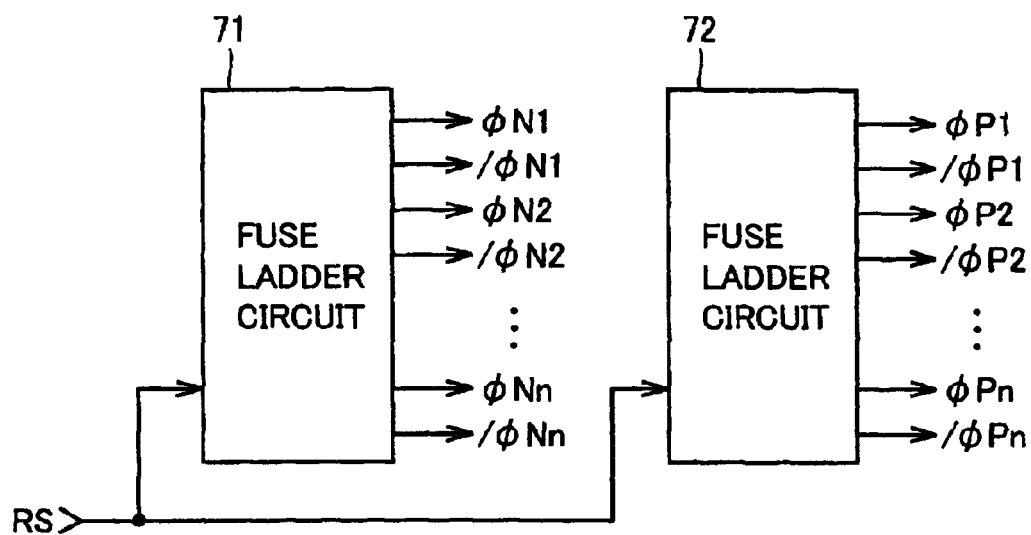
FIG. 10 is a block diagram illustrating a schematic structure of fuse ladder circuits used in the output buffer circuit shown in FIG. 9.

FIG. 10 is a block diagram illustrating a schematic structure of fuse ladder circuits 71 and 72 used in output buffer circuit 61 shown in FIG. 9. In FIG. 10, fuse ladder circuit 71 generates complementary switch signals $\phi N1$–$\phi Nn$ and /$\phi N1$–/$\phi Nn$ based on external reset signal RS. Fuse ladder circuit 72 generates complementary switch signals $\phi P1$–$\phi Pn$ and /$\phi P1$–/$\phi Pn$ based on external reset signal RS. The circuit structure of each of fuse ladder circuits 71 and 72 is the same as that of fuse ladder circuit 3 shown in FIG. 3.

Therefore, in the second embodiment, by providing two fuse ladder circuits for output buffer circuit 61, P-channel MOS transistors 27.1–27.$n$ and N-channel MOS transistors 28.1–28.$n$ in correction circuit 14 can individually be set to be conductive/nonconductive. Thus, current driving capability of output buffer circuit 61 can be finely adjusted by individually coping with variations in characteristics of P-channel MOS transistors and N-channel MOS transistors caused during a manufacturing process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit of a semiconductor device for outputting an internal signal to an outside, comprising:

an inverter including a first transistor of a first conductivity type and a second transistor of a second conductivity type connected between lines of first and second power supply potentials and an output node, respectively, and having input electrodes both receiving said internal signal;

a third transistor of the first conductivity type and a first resistor connected in series between the line of said first power supply potential and said output node; and an adjustment circuit including a fuse, for making said third transistor nonconductive when said fuse is not blown, and connecting input electrodes of said first and said third transistors when said fuse is blown, to adjust current driving capability of said output circuit.

2. The output circuit of a semiconductor device according to claim 1, further comprising a fourth transistor of the second conductivity type and a second resistor connected in series between the line of said second power supply potential and said output node, wherein said adjustment circuit further makes said fourth transistor nonconductive when said fuse is not blown, and connects input electrodes of said second and said fourth transistors when said fuse is blown.

3. The output circuit of a semiconductor device according to claim 1, wherein a plurality of sets of said third transistor, said first resistor, and said adjustment circuit are provided, said output circuit further comprising a monitor circuit including a fifth transistor of the first conductivity type and a sixth transistor of the second conductivity type connected between the lines of said first and said second power supply potentials and an output node, respectively, and having input electrodes both receiving a monitor signal, for determining a number of fuses to be blown.

4. The output circuit of a semiconductor device according to claim 1, wherein said semiconductor device is formed on a semiconductor substrate, and said adjustment circuit is provided at a corner of said semiconductor substrate.

* * * * *